(12) United States Patent
Somerkoski

(10) Patent No.: US 9,318,685 B2
(45) Date of Patent: Apr. 19, 2016

(54) METHOD FOR PRODUCING A SUPERCONDUCTIVE ELEMENT

(75) Inventor: Jukka Somerkoski, Ulvila (FI)

(73) Assignee: Luvata Espoo Oy, Espoo (FI)

( * ) Notice: Subject to any disclaimer, the term of this patent is extended or adjusted under 35 U.S.C. 154(b) by 272 days.

(21) Appl. No.: 11/921,722

(22) PCT Filed: May 11, 2006

(86) PCT No.: PCT/FI2006/000153
§ 371 (c)(1),
(2), (4) Date: Aug. 5, 2008

(87) PCT Pub. No.: WO2006/120291
PCT Pub. Date: Nov. 16, 2006

(65) Prior Publication Data
US 2008/0318793 A1   Dec. 25, 2008

(30) Foreign Application Priority Data

May 13, 2005 (FI) ...................... 20050509

(51) Int. Cl.
*H01L 39/24* (2006.01)
*H01L 39/14* (2006.01)

(52) U.S. Cl.
CPC ............ *H01L 39/2403* (2013.01); *H01L 39/14* (2013.01)

(58) Field of Classification Search
CPC ....... H01L 39/02; H01L 39/14; H01L 39/143; H01L 39/24; H01L 39/2403; H01L 39/2406; H01L 39/2409; H01L 39/248; H01B 12/02; H01B 12/06; H01B 12/10; H01B 12/16; H01B 13/00; H01F 6/06
USPC ......... 505/220, 230, 430, 472–474, 704–706; 427/62; 174/125.1; 29/599; 228/180.5, 228/259; 148/23, 24; 204/192.24; 205/238, 205/252
See application file for complete search history.

(56) References Cited

U.S. PATENT DOCUMENTS

| 3,504,105 | A | * | 3/1970 | Maier et al. ................. 174/125.1 |
| 3,644,988 | A | * | 2/1972 | Anderson ........................ 29/599 |
| 4,161,062 | A | * | 7/1979 | Agatsuma et al. .............. 29/599 |
| 5,851,482 | A | * | 12/1998 | Kim .............................. 420/557 |
| 6,762,673 | B1 | * | 7/2004 | Otto et al. ..................... 338/32 S |
| 7,089,647 | B2 | | 8/2006 | Hentges et al. |
| 2002/0163412 | A1 | * | 11/2002 | Xu et al. ........................ 335/299 |
| 2003/0059652 | A1 | * | 3/2003 | Wang et al. ................... 428/702 |
| 2004/0222011 | A1 | * | 11/2004 | Kohayashi et al. ......... 174/125.1 |
| 2004/0226163 | A1 | * | 11/2004 | Hentges et al. ................. 29/599 |

FOREIGN PATENT DOCUMENTS

| DE | 2749052 A1 | | 5/1978 |
| EP | 1 445 834 A2 | | 11/2004 |
| JP | 56053871 | | 5/1981 |
| JP | 04-071112 | * | 3/1992 |
| JP | 04-106809 | * | 4/1992 |
| JP | 4106809 | | 4/1992 |
| JP | 09-073821 | * | 3/1997 |

* cited by examiner

Primary Examiner — Paul Wartalowicz
(74) Attorney, Agent, or Firm — Hodgson Russ LLP

(57) ABSTRACT

The invention relates to a method for producing a superconductive element to be used as a wire-in-channel superconductor in magnetic resonance imaging (MRI) and in nuclear magnetic resonance (NMR) applications, which superconductive element contains a superconductive wire and a copper component having a longitudinal groove and the superconductive wire being positioned in the groove. In order to produce the wire-in-channel superconductive element by a mechanical contact between the superconductive wire and a wall of the groove in the copper component, at least one contact surface is coated with a lead free solder material before having the mechanical contact. In order to enhance the thermal and electrical conduction and to create a bond between the said components the soldering material is fused in annealing process step.

16 Claims, No Drawings

METHOD FOR PRODUCING A SUPERCONDUCTIVE ELEMENT

The invention relates to a method for producing a superconductive element and the superconductive element produced by the method, which superconductor will be used as a wire-in-channel superconductor in magnetic resonance imaging (MRI) and in nuclear magnetic resonance (NMR) applications.

Wire-in-channel (WIC) superconductors have been developed for MRI and NMR applications because these applications require long unit lengths, high unit weights and rather high volume fractions of copper in the conductor. The preferred solution is to process the expensive superconductive composite wire and copper component separately and to join them together at final process stages in order to achieve a wire-in-channel conductor. For this joint between the copper component and the superconductive wire, the copper component is provided with a longitudinal groove, wherein the superconductive wire is inserted.

In the wire-in-channel conductor fabrication it is known to use a solder, containing 60% by weight lead and 40% by weight tin. When producing this conductor the wire is inserted into the grooved copper component, so that the wire is located essentially in the groove. The combination of the wire and the grooved copper component is accomplished by running them both through a lead-tin melt and further through a drawing die, which provides the superconductor with accurate dimensions and suitable mechanical properties. Lead serves as good lubricant in this molten state drawing step.

The process involving simultaneous hot tinning and molten state drawing step possesses inherent drawbacks, for instance flux reactions with the melt and dissolution of copper into the melt which result in frequent cleaning and decoppering needs and thus decreased production, lower unit lengths and increased unexpected scrap rate. In addition, use of lead free solder to lubricate die drawing action will create new challenges.

The JP publication 2000-294053 relates to a method for producing a wire-in-channel superconductor for magnetic resonance imaging applications. In this method the drawbacks of lead are eliminated so that any solder is not used in the production of a wire-in-channel superconductor. A stable mechanical contact between the superconductive wire and the grooved copper component is achieved by working the grooved copper component so that the wire is essentially completely circulated by the grooved copper component. However, this kind of mechanical contact is not sufficient, because particularly the magnetic resonance imaging applications require a contact having good heat conductivity and a good electrical conductivity between the wire and the wall of the groove.

The object of the present invention is to eliminate some drawbacks of the prior art and to achieve an improved method for producing a wire-in-channel superconductive element to be used in magnetic resonance imaging (MRI) and in nuclear magnetic resonance (NMR) applications in which method lead free solder is used in the mechanical contact between the superconductive wire and the wall of the grooved copper component. The invention relates to the wire-in-channel superconductive element produced by this improved method, too. The essential features of the invention are enlisted in the appended claims.

In accordance with the invention, a wire-in-channel superconductor to be used in magnetic resonance imaging (MRI) and in nuclear magnetic resonance (NMR) applications contains a superconductive wire and a copper component so that the superconductive wire is positioned in a longitudinal groove formed in the copper component, and the mechanical contact between the superconductive wire and the wall of the groove in the copper component is achieved with a lead free solder material. The solder material is coated on at least one of the surfaces, the superconductive wire and/or the wall of the groove in the copper component, before achieving the mechanical contact in order to produce a wire-in-channel superconductive element.

In a preferred embodiment of the invention the superconductive wire before positioning into the groove of the copper component is coated with a solder, such as tin and tin based lead-free alloys. The pure tin has at low temperature a phase transition and becomes brittle. Therefore, it is preferred to use tin based lead-free alloys, such as a binary alloy tin-silver containing 0.1 to 20% by weight silver, preferably 0.1 to 5% by weight silver. Other preferred tin based lead-free alloys are for instance binary alloys such as tin-copper, tin-zinc, tin-antimony, tin-bismuth and tin-indium. As preferred tin based lead-free alloys are further ternary and quaternary alloys as well as alloys having even four with tin alloyed components from the group of copper, silver, zinc, antimony, bismuth and indium so that the content of each alloyed component is 0.1 to 20% by weight, preferably 0.1 to 5% by weight, the rest being tin and possible impurities.

It is also advantageous to use as preferred tin based lead-free alloys a binary alloy of tin-bismuth in which alloys the bismuth content is 20 to 60% by weight, the rest being tin and possible impurities. The binary alloy tin-bismuth with the bismuth content of 20 to 60% by weight can further be alloyed with one or two components from the group of copper, silver, zinc, antimony and indium so that the content of each alloyed component is 0.1 to 20% by weight, preferably 0.1 to 5% by weight and the rest being tin and possible impurities.

According to one preferred embodiment of the invention the tin based lead-free alloy is a binary alloy of tin-indium in which alloys the indium content is 20 to 60% by weight, the rest being tin and possible impurities. The binary alloy tin-indium with the indium content of 20 to 60% by weight can further be alloyed with one or two components from the group of copper, silver, zinc, antimony and bismuth so that the content of each alloyed component is 0.1 to 20% by weight, preferably 0.1 to 5% by weight and the rest being tin and possible impurities.

In another embodiment of the invention the groove of the copper component is coated with tin or one of the tin based lead-free alloys. In this case the superconductive wire is without any coating.

In still another embodiment of the invention both the superconductive wire and the groove of the copper component are coated with tin or one of the tin based lead-free alloys.

The coating of the surface in the mechanical contact between the superconductive wire and the copper component is advantageously produced by electroplating, hot tinning, chemical vapour deposition (CVD) or physical vapour deposition (PVD) techniques.

In the case of hot tinning the coating treatment is carried out in a continuous hot dipping mode by letting the surface of the superconductive wire or the groove of the copper component be in contact and wet with solder melt for a period of time, 0.1 to 30 seconds, preferably 0.1 to 5 seconds, to ensure cleaning of the surface from flux traces and metal oxides. The temperature of the solder melt shall be above the liquidus temperature, preferably 30 to 100° C. depending on the line speed and the solder alloy.

After coating the channel profile is worked, or formed so that an intimate contact between the superconductive wire and the wall or walls of the groove of the copper component is generated. Deformation is achieved by generally known methods, such as using a four-roll rolling technique or a die, where through the combination of the superconductive wire and the copper component is drawn, the deformation degree being 1 to 38%, preferably 2-15%.

In order to finalize the contact between the superconductive wire and the wall or walls of the groove in the copper component, the combination of the superconductive wire and the copper component is annealed to form a metallic bond, which essentially enhances the thermal and electrical conductivity of the interface and increases the mechanical integrity of the components. The annealing treatment is carried out at the temperature higher than the solidus temperature of the solder alloy, i.e. the temperature at which the solder alloy begins to melt on heating, preferably above the liquidus where the solder is fully liquid, to achieve a metallic and/or intermetallic interface between the wire and the wall or the walls of the groove which treatment ensures and provides with good thermal and electrical conduction between parts. Preferably, the annealing treatment is carried out at the temperature range 150 to 400° C., preferably 200 to 350° C., the annealing time being between 1 second and 2 h and dependent on the solder alloy as well as the annealing technique. The annealing techniques can be one of the known annealing techniques, such as batch annealing, forced flow convection annealing, strand annealing, infrared radiation, inductive annealing or resistive annealing techniques.

When annealing it is desirable that the soldering material is melted and fused at the temperature range below the softening temperature in order to retain the advantageous mechanical properties of the superconductive wire and the grooved copper component obtained in the preceding forming operation.

The invention claimed is:

1. Method for producing a superconductive element to be used as a wire-in-channel superconductor in magnetic resonance imaging (MRI) and in nuclear magnetic resonance (NMR) applications, comprising the steps of:
   providing a superconductive wire and a copper component having a longitudinal groove;
   positioning the superconductive wire in the groove;
   creating mechanical contact with at least one contact surface between the superconductive wire and a wall of the groove in the copper component;
   deforming to produce an intimate contact between the at least one contact surface;
   annealing the deformed superconductive wire and copper component at a temperature higher than the solidus temperature of a lead free solder material to achieve a metallic or intermetallic interface between the wire and the wall or the walls of the groove;
   wherein the at least one contact surface is coated with the lead free solder material before having the mechanical contact;
   wherein the lead free solder material is in contact with the superconductive wire;
   wherein the lead free solder material is a tin based alloy;
   wherein the tin based alloy is a binary alloy of tin-bismuth in which the bismuth content is 20 to 60% by weight; and
   wherein the binary alloy of tin-bismuth is alloyed with one or two components from the group of copper, silver, zinc, antimony and indium so that the content of each alloyed component is 0.1 to 20% by weight and the rest being tin or tin and impurities.

2. Method according to the claim 1, wherein the superconductive wire is coated with the lead free solder material.

3. Method according to the claim 1, wherein the wall of the groove in the copper component is coated with the lead free solder material.

4. Method according to the claim 1, wherein the superconductive wire and the wall of the groove in the copper component are coated with the lead free solder material.

5. Method according to claim 1, wherein the contact surface is coated using electroplating techniques.

6. Method according to claim 1, wherein the at least one contact surface is coated using hot tinning techniques.

7. Method according to claim 1, wherein the at least one contact surface is coated using chemical vapour deposition techniques.

8. Method according to claim 1, wherein the at least one contact surface is coated using physical vapour deposition techniques.

9. Method according to the claim 1, wherein the annealing is carried out by batch annealing.

10. Method according to the claim 1, wherein the annealing is carried out by forced flow convection tube annealing.

11. Method according to the claim 1, wherein the annealing is carried out by strand annealing.

12. Method according to the claim 1, wherein the annealing is carried out by inductive annealing.

13. Method according to the claim 1, wherein the annealing is carried out by resistive annealing.

14. Method according to the claim 1, wherein the content of each alloyed component is 0.1 to 5% by weight.

15. A superconductive element to be used as a wire-in-channel superconductor in magnetic resonance imaging (MRI) and in nuclear magnetic resonance (NMR) applications produced using the method according to claim 1.

16. The superconductive element of claim 15, wherein the content of each alloyed component is 0.1 to 5% by weight.

* * * * *